United States Patent
Vali et al.

(10) Patent No.: US 7,408,814 B2
(45) Date of Patent: Aug. 5, 2008

(54) METHOD AND APPARATUS FOR FILTERING OUTPUT DATA

(75) Inventors: Tommaso Vali, Sezze (IT); Giovanni Santin, Rieti (IT); Michele Incarnati, Gioia dei Marsi (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/758,352

(22) Filed: Jun. 5, 2007

(65) Prior Publication Data

US 2007/0230256 A1     Oct. 4, 2007

Related U.S. Application Data

(62) Division of application No. 11/127,526, filed on May 12, 2005, now Pat. No. 7,227,789.

(30) Foreign Application Priority Data

Nov. 8, 2004    (IT) .................. RM2004A0554

(51) Int. Cl.
*G11C 7/00*    (2006.01)

(52) U.S. Cl. .............................. 365/189.05; 365/233.5
(58) Field of Classification Search ............ 365/189.05, 365/233.5
See application file for complete search history.

(56) References Cited

U.S. PATENT DOCUMENTS

| 5,198,999 | A | 3/1993 | Abe et al. |
| 5,682,391 | A | 10/1997 | Narayanan |
| 5,828,606 | A | 10/1998 | Mick |
| 5,953,286 | A | 9/1999 | Matsubara et al. |
| 6,556,472 | B2 * | 4/2003 | Yokozeki ..................... 365/154 |
| 6,735,679 | B1 | 5/2004 | Herbst et al. |
| 6,813,656 | B1 | 11/2004 | Odenwald et al. |
| 7,010,024 | B1 | 3/2006 | Eerola et al. |

* cited by examiner

*Primary Examiner*—Huan Hoang
(74) *Attorney, Agent, or Firm*—Leffert Jay & Polglaze, P.A.

(57) ABSTRACT

Apparatus and methods for filtering spurious output transitions with an adaptive filtering circuit which tracks the memory architecture and form factors with a reduced speed penalty. The filtering is selectable by a fuse option.

14 Claims, 7 Drawing Sheets

METHOD AND APPARATUS FOR FILTERING OUTPUT DATA

RELATED APPLICATIONS

This application is a Divisional of U.S. patent application Ser. No. 11/127,526, filed May 12, 2005 now U.S. Pat. No. 7,227,789 and titled, "METHOD AND APPARATUS FOR FILTERING OUTPUT DATA" which is commonly assigned and incorporated by reference in its entirety herein, and which claims priority to Italian Patent Application Serial No. RM 2004A000554, filed Nov. 8, 2004, which is commonly assigned.

FIELD

The present invention relates generally to memories and in particular the present invention relates to memory data output.

BACKGROUND

A critical parameter in memories and particularly nonvolatile memories like flash memories is the access time to access data. When reading randomly from a memory core such an access is defined as an asynchronous access, (defined as $T_{ace}$, data valid from a chip enable complement CE* transition). When reading data there can be spurious glitches on the data connections (DQs), which can usually be filtered out at the expense of increasing data access time.

Referring to FIGS. 1 and 2, which are a block diagram of a memory and a timing diagram of data passing from the memory, the access time $T_{ace}$ is driven by three main circuit blocks, the memory core 102, data path component 104, and output buffer component 106. Memory core 102 contains a memory array 108, sense amplifiers 110, address transition detector (atd) and read timer 112, and latch 114. Data path component 104 contains data path driver 116 and latch 118. Output buffer component 106 contains output buffers 120. The memory core 102 with the sense amplifiers 110, sets the amount of time needed from supply of signal CE*=0 to select the addressed location, to sense the data from the array 108 and have the data ready and presented at the memory bank boundary. The data path circuit 104 controls data propagation through the memory 100 up to the pad area and the output buffers 120 are used to drive the output load.

Typically, the output buffers 120 are set as pass through buffers at the beginning of the read phase, allowing an immediate transition as soon as the internal data is read from the array 108 and propagated through the data path 104. The delay, as shown in FIG. 2, is $\Delta\tau 0$. Such approach has the side effect of making the output buffers transparent to any transition of the data path even when the data are not valid yet. The architecture of the data path drives the timing and number of such undesired spurious transitions (FIGS. 1-2).

In working with very fast memories, it is desirable to decrease the time data takes to propagate from the sense amplifiers to the output buffers. One way to do this is to keep all data communications from the sense amplifiers to the output buffers transparent. When new data is detected at the sense amplifiers, it propagates to the output buffers. This allows for a minimum time delay from the sense amplifiers to the output buffers. However, the sense amplifiers in reading data from the array generate spurious data outputs before stabilization to valid data. This spurious data output propagates to the output buffers as noise before stabilization. There is a minimum time delay $\Delta\tau 0$ that data takes to move from the input of the data path driver 116 to the output from data path latch 118. When access time $T_{ace}$ is set for the device 100, then, the specification for the device indicates that the data are not valid until expiration of the minimum access time $T_{ace}$. Spurious data cannot be considered good data until the access time expires. While such an approach is very fast, the transitions in the spurious data greatly increase memory power consumption because of the switching of the output buffers. This current consumption without information is inconvenient for customers and consumes power, which is in increasingly short supply in today's memories.

To avoid the spurious output switching of the configuration shown in FIG. 1, a conventional approach to the problem of spurious output transitions is shown in FIG. 3, and is based on the use of a second atd and read timer circuit 202 which takes the same inputs as the atd and read timer 112 of memory 100, to generate a signal (sa_latch_filter in FIG. 3) to mask all of the internal data path transitions immediately before the output buffer drivers 120. This signal enables the output buffers 120 only after the data are stable, by opening keeping latch 118 closed until the signal has propagated through atd and read timer 202, and opening latch 118 at that time. The calculated time is longer than Tace minimum by a margin, Tm. The margin Tm is added to the minimum Tace to cover the time needed to enable the latch.

The approach of FIG. 3 uses the margin Tm to allow the signal to cut all of the undesired spurious data transitions. This time Tm must allow sufficient propagation time based on the maximum expected time to eliminate all possibility of spurious transitions. Defining the value for Tm requires an accurate evaluation of two parameters, the addressed data sensing time and the data propagation delay to the output buffers. Both parameters depend upon process spread, architecture, layout and memory size, and therefore some estimation is required. To avoid the possibility of invalid data at the output buffers, the margin Tm is increased to a safe time. The uncertainty about these parameters evaluation drives the Tm value up.

For the reasons stated above, and for other reasons stated below which will become apparent to those skilled in the art upon reading and understanding the present specification, there is a need in the art for apparatus and techniques for filtering spurious data output but increasing speed of access.

DETAILED DESCRIPTION

Figure 1:
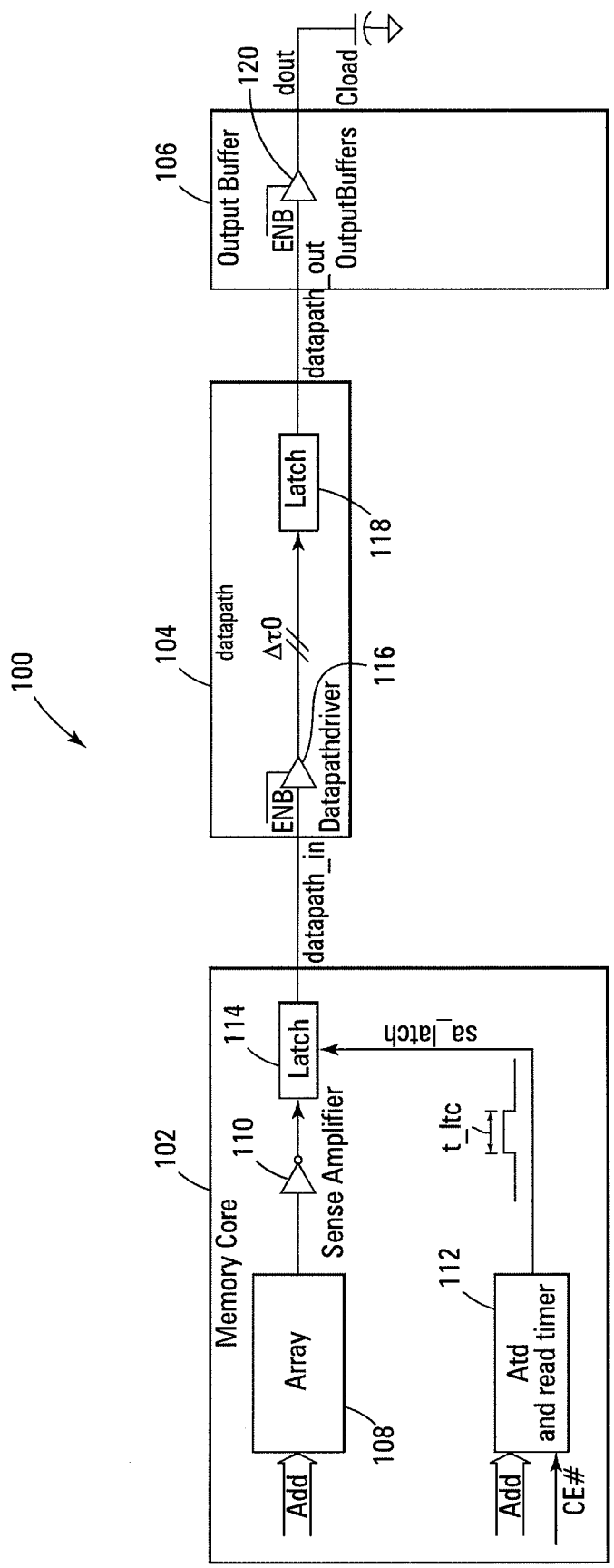
FIG. 1 is a block diagram of a memory of the prior art.
Figure 2:
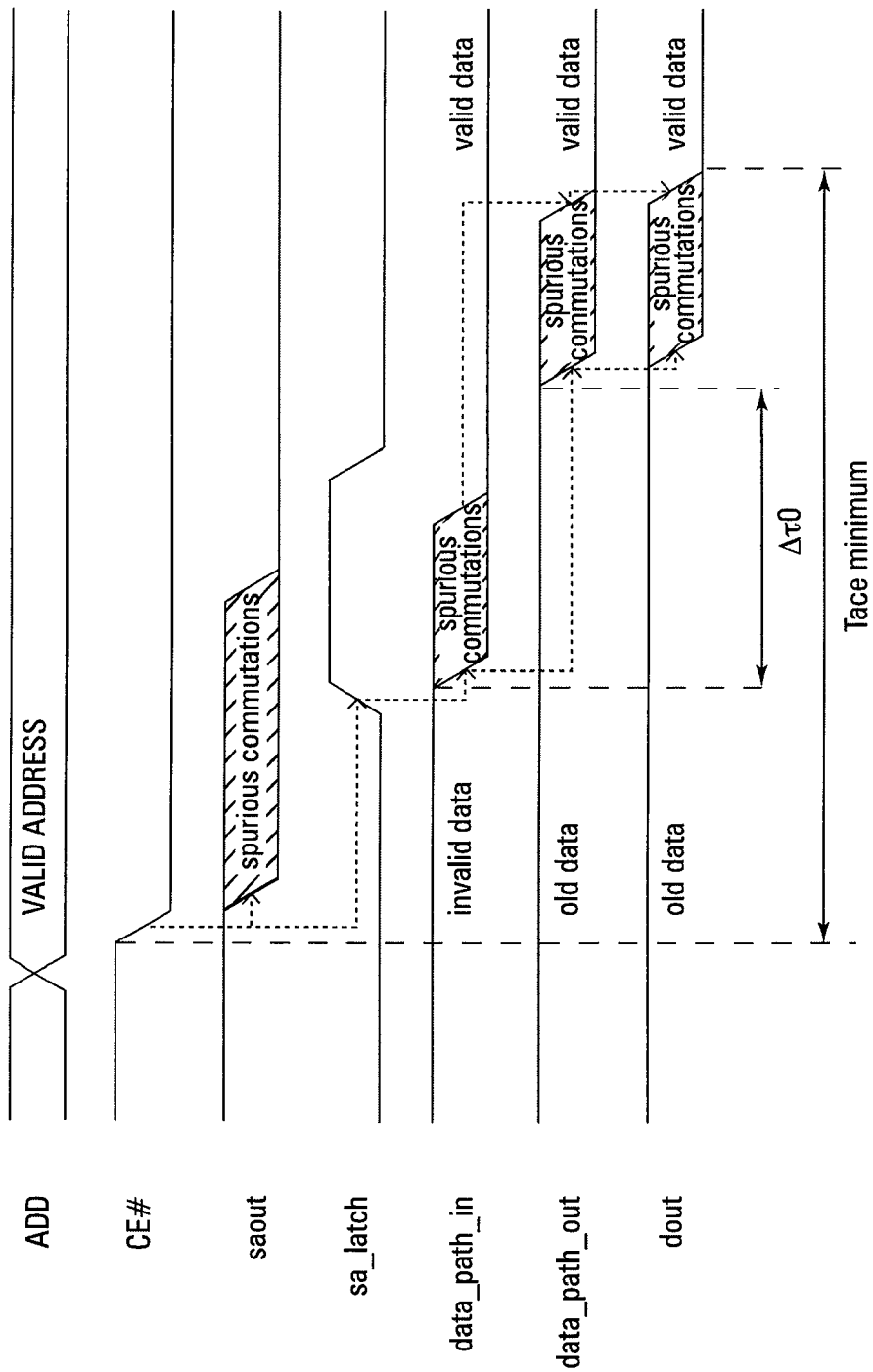
FIG. 2 is a timing diagram for operation of the memory of FIG. 1.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled.

The embodiments of the present invention utilize the same signal already used for sense amplifier temporization in a memory to identify the time at which data read from the memory are valid at the sense amplifier output. The signal is propagated from the active sense amplifier to output buffers through a path that mimics the read data path of the memory. Due to the paths being the same, the signal activation is contemporaneous to the presence of valid data along all data paths, so the signal indicating that reading of the output data path will result in valid data being read is contemporaneous with arrival of valid data. The paths are identical, and therefore the smallest additional margin time is achieved, but all spurious transitions are complete.

Figure 5:
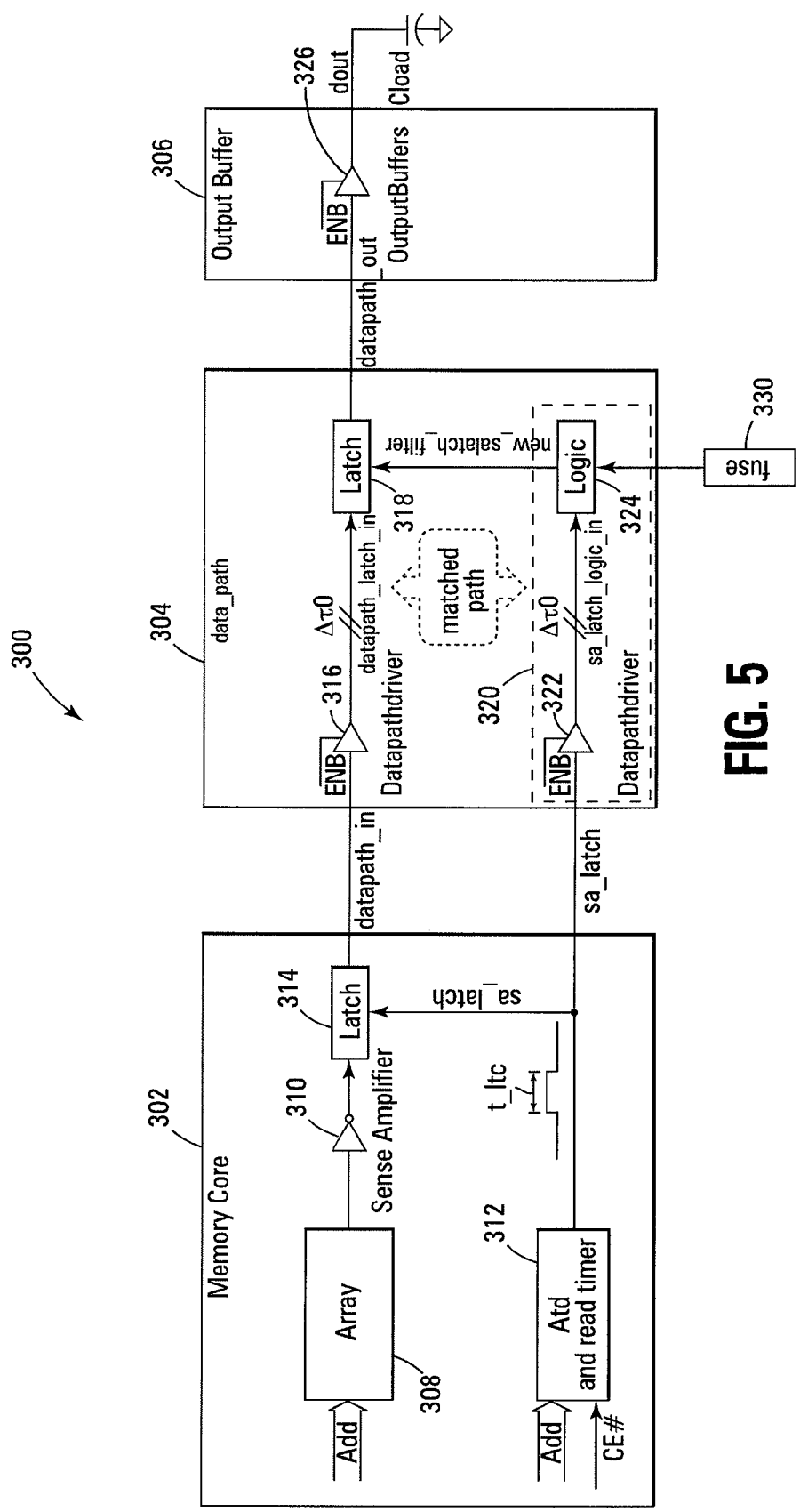
FIG. 5 is a block diagram of a memory according to one embodiment of the present invention.

Referring to FIG. 5, a memory 300 according to one embodiment if the present invention is shown. Memory 300 comprises memory core 302, data path component 304, and output buffer 306.

Memory core 302 comprises a memory array 308, sense amplifiers 310, address transition detector (atd) and read timer 312, and latch 314. Data path component 304 comprises data path driver 316, latch 318, and matched path 320. Matched path 320 comprises in one embodiment a second data path driver 322 identical to data path driver 316, and logic 324 for enabling new—salatch_filter signal for control of latch 318. Output buffer component 306 comprises output buffers 326. The memory core 302 with the sense amplifiers 310, sets the amount of time needed from supply of signal CE*=0 to select the addressed location, to sense the data from the array 308 and have the data ready and presented at the memory bank boundary. The data path circuit 304 controls data propagation through the memory 300 up to the pad area and the output buffers 326 are used to drive the output load.

In operation, atd and read timer 312 receives a chip enable signal CE* and an address. The address is also received at array 308. Sense amplifier 310 senses the data at the received address and feeds the data to latch 314. Latch 314 is enabled by a signal, sa_latch, from atd and read timer 312. This same signal, sa_latch, is propagated ultimately to latch 318 to enable the data to be sent to the output buffer component 306 using a path 320 that is matched to the path the data follows through the data path component 304. The two paths, data through the data path driver 316, and the sa_latch signal through an identical data path driver 322 data path to output, are matched with the same propagation delay. When the data is valid in the memory core, it takes a certain amount of time to propagate, but the same latch signal that enables data to be fed from the memory core 302 is fed in parallel through matched path 320, the valid data and the signal new_salatch_filter arrive at the latch 318 simultaneously. This assures that all data spurious commutations are masked, but no extra delay is present beyond the small delay for enabling the latch 318. In the memory 300, logic 324 accepts as input the sa_latch_logic_in signal from data path driver 322, and determines on the basis of the status of a signal from fuse 330 whether to delay the opening of latch 318 or to operate the memory 300 as a standard unfiltered memory such as that shown in FIG. 1.

The memory embodiment 300 is configured to allow one of two configurations. The output buffers 326 can be set either as pass through buffers, or as filtered output buffers, depending on the signal from logic 324. The configurations allow a choice as to whether to use the memory 300 in a very fast but noisy configuration, or in a fast non-noisy configuration that is significantly faster than a conventional filtered approach. In one embodiment, the option is set during programming, at the factory, and cannot be changed. In one embodiment, the configuration is enabled by a non-volatile bit, realized with a FAMOS cell fuse, allowing the selection of the filtered or unfiltered output depending upon the specific customer need and access time specification.

The new_salatch_filter signal and the valid data reach the pad area simultaneously, and the memory 300 requires no additional margin on top of the margin it already has at the sense amplifier level. Fuse 330 is used to set the new_salatch_filter signal (to enable use of the filtered data path) as active, thus allowing the device to be set into the two different configurations. The first configuration is "mask signal active" in which no spurious transitions are present on the output buffers and the asynchronous access time penalty is very short. The second configuration is "mask signal inactive" in which spurious transitions are present on the output buffers but asynchronous access time is at a minimum.

The matched path 320 consumes very little real estate within the memory since only one matched path is needed for an entire memory.

The embodiments of the present invention overcome the criticalities with memory circuits by using a signal generated from the last event of the sensing phase and propagated to the output buffers with a path which tracks the data path. This reduces the delay time and still filters the output so that the output data does not have bad data prior to the valid point.

In one embodiment, once the active mask signal is enabled, the memory operates in the masking configuration permanently. However, it should be understood that the nonvolatile bit such as fuse 330 is capable of being reprogrammed at a later time provided the option is left to reprogram the bit. This is within the scope of the present invention.

Figure 3:
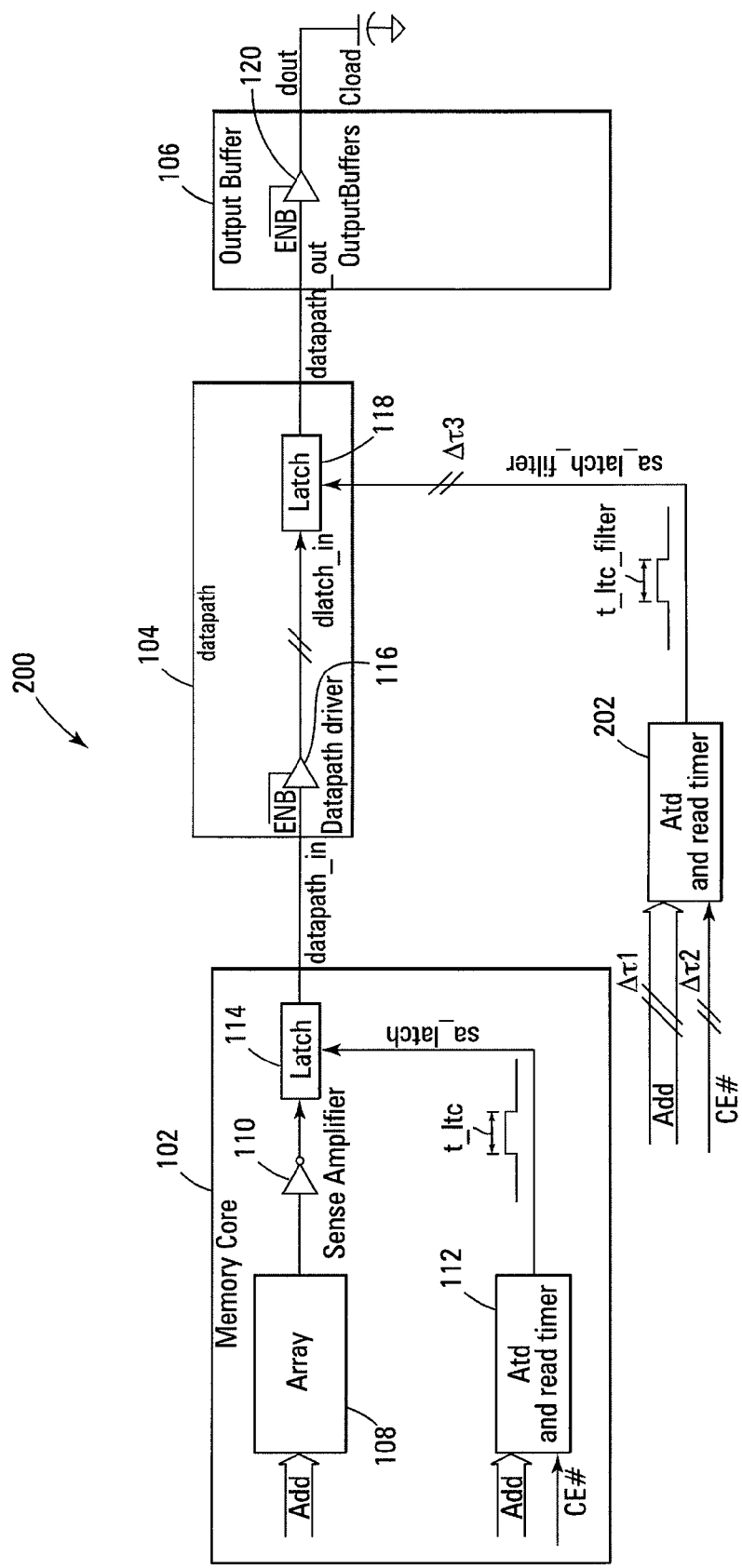
FIG. 3 is a block diagram of another memory of the prior art.
Figure 6:
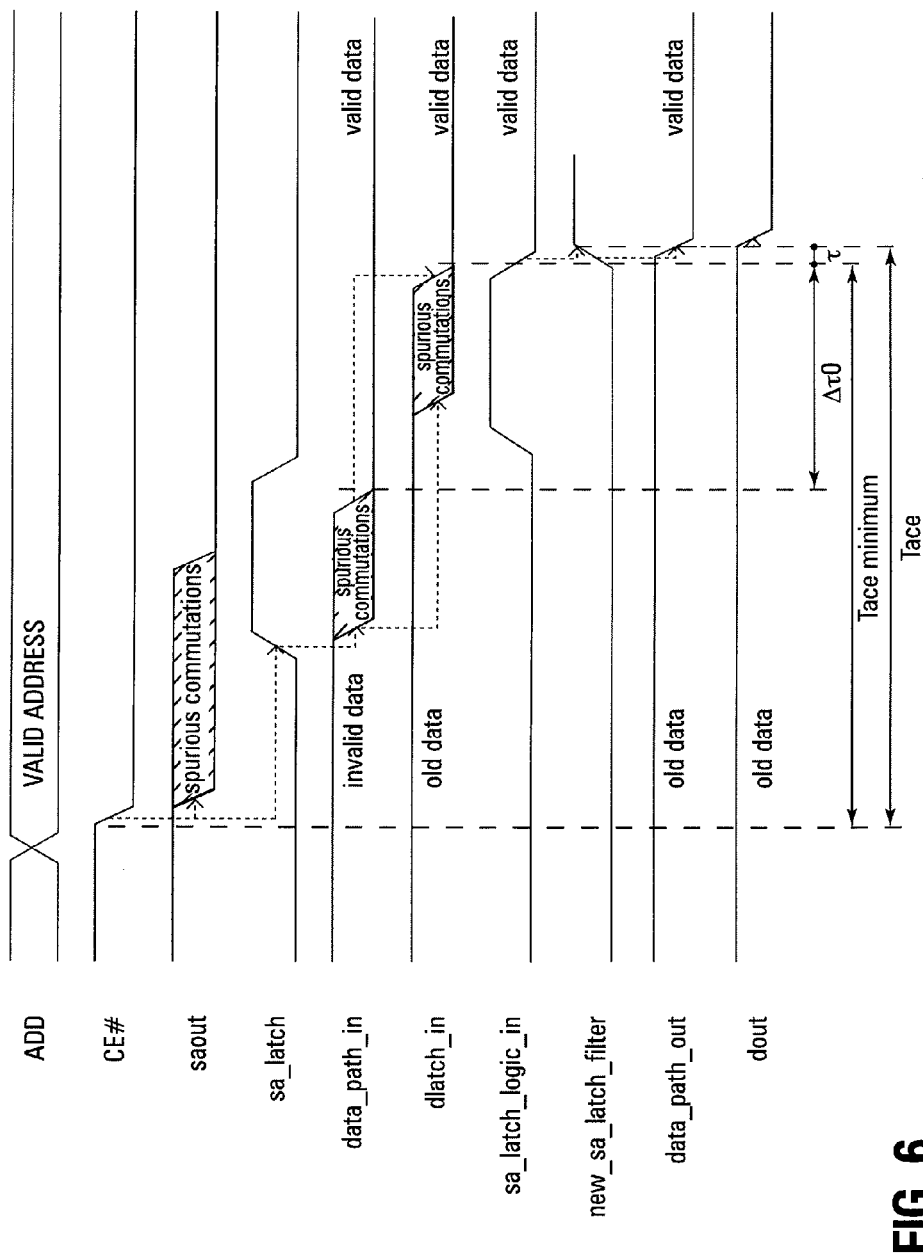
FIG. 6 is a timing diagram for operation of the memory of FIG. 5.
Figure 7:
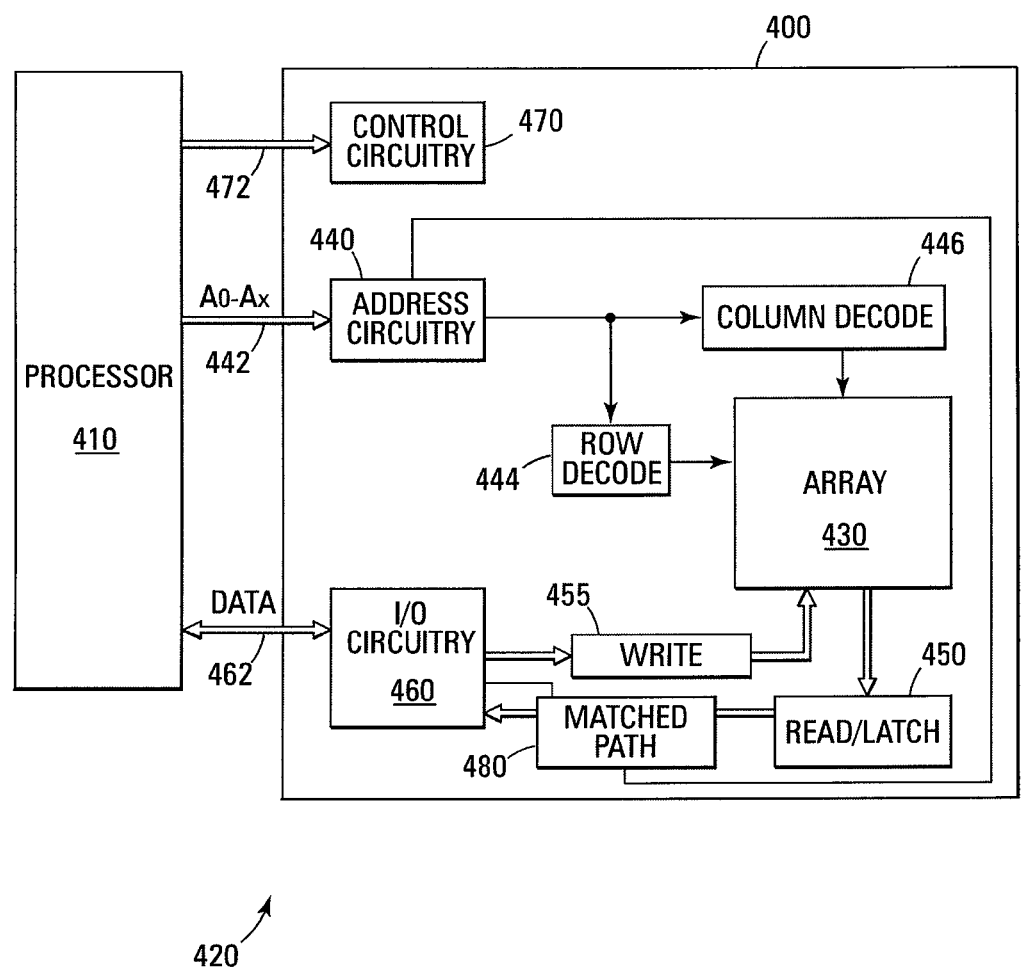
FIG. 7 is a block diagram of a memory and system according to another embodiment of the present invention.

The embodiments of the present invention shown in FIGS. 5-6 are self-adapting to the conditions in which the memory operates. When a different signal is used to generate a delay such as that shown in FIG. 3, with two atd and read timer circuits, one circuit allowing for masking of spurious data, and one propagating data through the memory, two different signals in two different parts of the device are used. Those two signals may act differently with power supply or temperature changes. Any differences between devices and locations within the device, including but not limited to sensitivity, location, and temperature, have different delay potentials. Further, power supply changes could also affect the signals differently. The present embodiments use the same signal, which ensures that changing conditions affect each path the same, so the delay in the two circuits is the same.

Figure 4:
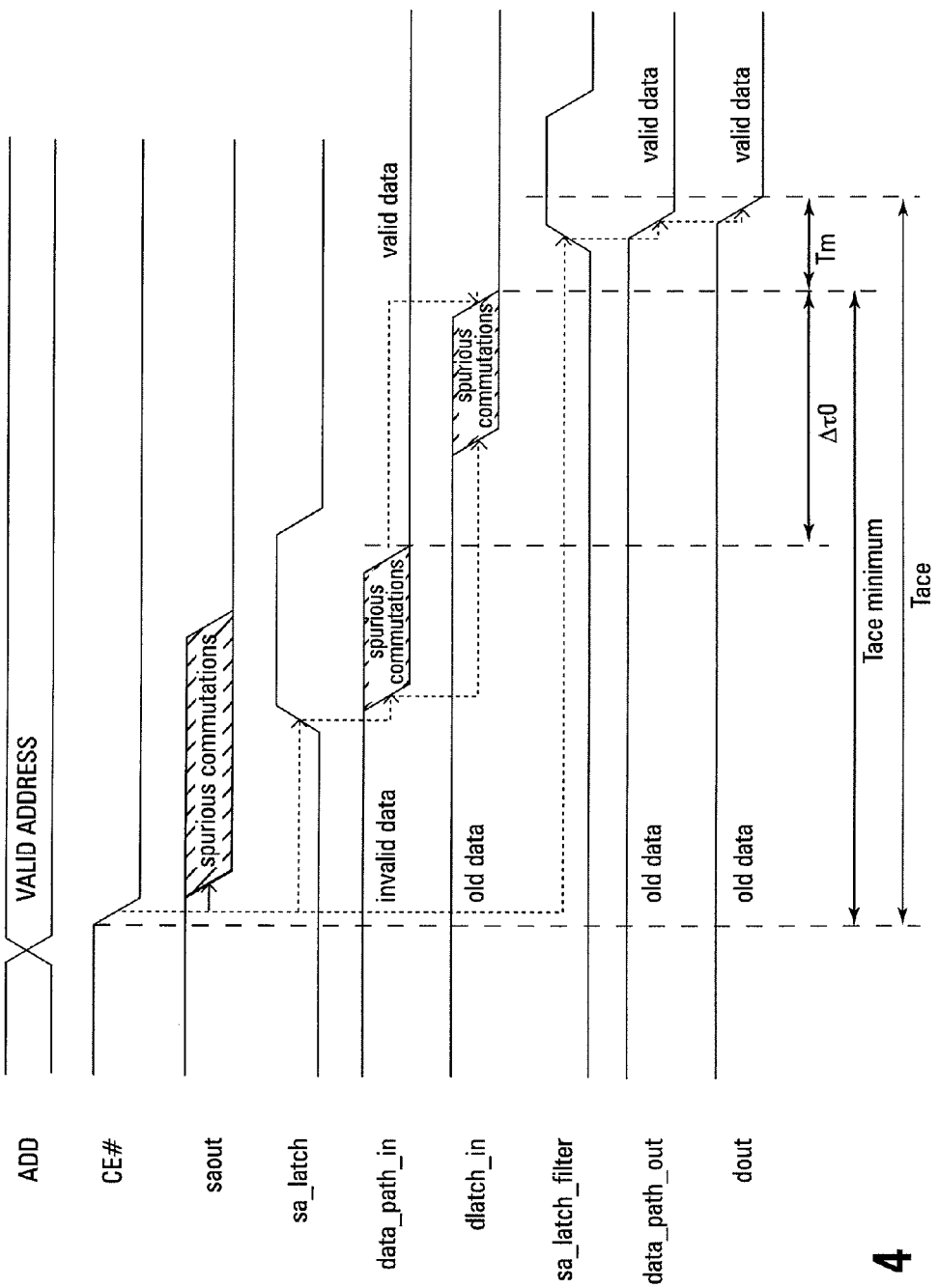
FIG. 4 is a timing diagram for operation of the memory of FIG. 3.

A memory suitable for use with the embodiments of the present invention is shown in FIG. 4, which is a functional block diagram of a memory device 400, such as a flash memory device, of one embodiment of the present invention, which is coupled to a processor 410. The memory device 400 and the processor 410 may form part of an electronic system 420. The memory device 400 has been simplified to focus on features of the memory that are helpful in understanding the present invention. The memory device includes an array of memory cells 430. The memory array 430 is arranged in banks of rows and columns.

An address buffer circuit 440 is provided to latch address signals provided on address input connections A0-Ax 442. Address signals are received and decoded by row decoder 444 and a column decoder 446 to access the memory array 430. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 430 by sensing voltage or current changes in the memory array columns using sense/latch circuitry 450. The sense/latch circuitry, in one embodiment, is coupled to read and latch a row of data from the memory array. Data input and output buffer circuitry 460 is included for bi-directional data communication over a plurality of data (DQ) connections 462 with the processor 410, and is connected to write circuitry 455 and read/latch circuitry 450 for performing read and write operations on the memory 400.

Command control circuit 470 decodes signals provided on control connections 472 from the processor 410. These signals are used to control the operations on the memory array 430, including data read, data write, and erase operations. Matched path circuitry 480 is connected to the address circuitry 440 and to read/latch 450 and I/O circuitry 460. The matched path circuitry in one embodiment includes the fuse 330 described above. It should be understood that the flash memory device 400 has been simplified to facilitate a basic understanding of the features of the memory. A more detailed understanding of internal circuitry and functions of flash memories are known to those skilled in the art.

Advantages of the embodiments of the present invention include a reduced speed penalty on access time when in filtered configuration (compared to previous filtered configuration); self adaptation to the data path architecture (i.e., when shrinking to a new technology node or when increasing the memory size) that does not require a new reassessment of the delays, since the paths will propagate at their minimum times and valid data will arrive at the output buffers at the same time the new_sa_latch_filter signal enabling the latch arrives; and configurable use with a fuse allowing the customer to decide at the factory level whether the customer requires a minimum access time at the penalty of spurious data, or a reduced speed penalty over traditional filtered approaches and valid data.

CONCLUSION

Circuits and methods have been described that include using a signal generated from the last event of a sensing phase, propagated to the output buffers with a patch which tracks the data path. The feature is enabled in one embodiment by a non-volatile bit, allowing the selection of the filtered or not filtered output depending upon the specific customer need and access time specification.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory device, comprising:
   a memory core comprising an array of memory cells, sense amplifier circuitry to sense data from the array, a latch to latch sensed data, and an address transition detector and read timer to generate a sense amplifier latch signal when data is addressed and sensed from the array;
   an output buffer to provide data to an output; and
   a data path circuit between the memory core and the output buffer along which data is propagated from the array of memory cells to the output, the data path circuit having a first path for data, comprising a first data path driver and a data latch in series; and a second path for a data latch enable signal, comprising a second data path driver identical to the first data path driver and logic to enable a first filtered configuration or a second non-filtered configuration.

2. The memory device of claim 1, and further comprising:
   a non-volatile bit component providing a second path enable signal to the logic, the enable signal enabling either the first configuration or the second configuration.

3. The memory device of claim 2, wherein the non-volatile bit component comprises a FAMOS cell fuse.

4. A data path circuit for a memory, comprising:
   a first branch comprising a first data path driver connected in series with a data path latch, the first branch to propagate data from an input data source to an output; and
   a second branch parallel to the first branch, the second branch comprising a second data path driver and a logic component, the second data path driver identical to the first data path driver, the logic component to provide a latch signal to the data path latch, the second branch to generate a data path latch enable signal from an external sense amplifier latch enable signal.

5. The data path circuit of claim 4, wherein the second branch is configured to provide a first configuration in which data in the first branch is unfiltered, or a second configuration in which data in the first branch is filtered to eliminate noise.

6. A processing system, comprising:
   a processor; and
   a memory coupled to the processor to store data provided by the processor and to provide data to the processor, the memory comprising:
   a memory core comprising an array of memory cells, sense amplifier circuitry to sense data from the array, a latch to latch sensed data, and an address transition detector and read timer to generate a sense amplifier latch signal when data is addressed and sensed from the array;
   an output buffer to provide data to an output; and
   a data path circuit between the memory core and the output buffer along which data is propagated from the array of memory cells to the output, the data path circuit having a first path for data, comprising a first data path driver and a data latch in series; and a second path for a data latch enable signal, comprising a second data path driver identical to the first data path driver and logic to enable a first filtered configuration or a second non-filtered configuration.

7. The system of claim 6, and further comprising:
   a non-volatile bit component providing a second path enable signal to the logic, the enable signal enabling either the first configuration or the second configuration.

8. The system of claim 7, wherein the non-volatile bit component comprises a FAMOS cell fuse.

9. A memory device, comprising:
   a memory core comprising a memory array, sense amplifier circuitry, a latch, and an address transition detector and read timer;
   an output buffer; and
   a data path circuit connected between the memory core and the output buffer, the data path circuit having a first data path for data and a second data path identical to the first data path for a data latch enable signal.

10. The memory device of claim 9, wherein the first data path comprises a first data path driver and a data latch connected in series.

11. The memory device of claim 10, wherein the second data path comprises a second data path driver identical to the first data path driver and logic to enable a signal to control the data latch.

12. A memory device, comprising:
 a memory core comprising a memory array, sense amplifier circuitry, a latch, and an address transistion detector and read timer;
 an output buffer; and
 a data path circuit connected between the memory core and the output buffer, the data path circuit having a first data path comprising a first data path driver and a data latch connected in series, and a second data path identical to the first data path and comprising a second data path driver identical to the first data path driver and logic to enable a signal to control the data latch, wherein the logic is operable to enable a first latch output configuration or a second latch output configuration.

13. The memory device of claim 12, and further comprising a non-volatile bit component connected to the logic to provide a second path enable signal to the logic, the enable signal enabling either the first configuration or the second configuration.

14. The memory device of claim 12, wherein the first latch output configuration sets the output buffer as a pass through buffer, and wherein the second latch output configuration sets the output buffer as a filtered output buffer.

* * * * *

UNITED STATES PATENT AND TRADEMARK OFFICE
CERTIFICATE OF CORRECTION

| | |
|---|---|
| PATENT NO. | : 7,408,814 B2 |
| APPLICATION NO. | : 11/758352 |
| DATED | : August 5, 2008 |
| INVENTOR(S) | : Vali et al. |

Page 1 of 1

It is certified that error appears in the above-identified patent and that said Letters Patent is hereby corrected as shown below:

In column 6, line 63, in Claim 9, delete "transistion" and insert -- transition --, therefor.

In column 7, line 12, in Claim 12, delete "transistion" and insert -- transition --, therefor.

Signed and Sealed this

Twenty-first Day of October, 2008

JON W. DUDAS
*Director of the United States Patent and Trademark Office*